United States Patent [19]

Doak

[11] Patent Number: 5,512,856
[45] Date of Patent: Apr. 30, 1996

[54] METHOD AND APPARATUS FOR NONLINEAR COMPENSATION

[75] Inventor: David B. Doak, Boonton, N.J.

[73] Assignee: AT&T Corp., Murray Hill, N.J.

[21] Appl. No.: 363,766

[22] Filed: Dec. 23, 1994

[51] Int. Cl.⁶ .......................... H03F 1/34; H01L 41/04
[52] U.S. Cl. .................. 330/1 R; 330/107; 330/294; 330/149; 310/317
[58] Field of Search .................. 330/1 R, 107, 330/149, 294; 310/316, 317, 318

[56] References Cited

U.S. PATENT DOCUMENTS

| | | | |
|---|---|---|---|
| 4,628,275 | 12/1980 | Skipper | 330/10 |
| 4,689,514 | 8/1987 | Kondoh et al. | 310/317 X |
| 4,872,209 | 10/1989 | Blanken | 330/294 |
| 5,000,415 | 3/1993 | Sandercock | 248/550 |
| 5,264,752 | 11/1993 | Savicki | 310/316 |
| 5,315,266 | 5/1994 | Lorenz | 330/294 |

FOREIGN PATENT DOCUMENTS 8800811  10/1989  Netherlands ................ 310/318

*Primary Examiner*—James B. Mullins

[57] ABSTRACT

A method and apparatus for compensating for nonlinear responses of capacitive loads using a load reference element.

17 Claims, 4 Drawing Sheets

METHOD AND APPARATUS FOR NONLINEAR COMPENSATION

GOVERNMENT CONTRACT

This invention was made with Government support under Contract N00024-90-C-0258. The Government has certain rights in this invention.

BACKGROUND OF THE INVENTION

1. Field of the Invention

This invention relates generally to electronic signal conditioning; and more specifically, to a method as well as circuitry for compensating for nonlinear response characteristics of loads, in particular capacitive loads, driven by an amplifier.

2. Description of Related Art

Frequently, in the control of mechanical devices, high voltage amplifiers are used to drive piezoelectric actuators or other high-capacitance devices, which serve, in turn, to apply mechanical forces to the mechanical devices being controlled. Actuators can be formed from stacks of piezoceramic wafers which appear basically as pure capacitive loads to the high-voltage (driving) amplifier.

In certain instances the nonlinear response characteristics, exhibited to varying degrees by all ceramic composition capacitors, can be ignored, particularly in those applications where the capacitive load is being operated over a small range of voltage or where the nonlinear effects are unimportant. But in those applications where the capacitive load is being utilized for its piezoelectric properties of converting electrical energy to mechanical energy, the load must be driven over a large voltage range which exacerbates its nonlinear characteristics.

A few approaches to linearizing current through such purely capacitive loads exist. U.S. Pat. No. 5,000,415 discloses the use of charge and voltage feedback loops, positioned around the load so that the nonlinear voltage vs. displacement and the charge vs. displacement characteristics of the load tend to "cancel" each other. Also, in U.S. Pat. No. 4,628,275 a single feedback loop senses the charge from a large reference capacitor in series with the capacitive load. This last approach is not practical where the load capacitance is relatively large because the reference capacitor value becomes unreasonably large.

However, both approaches have in common the drawback that one or more control values must be fed back from the load to the controlling amplifier circuit. This can have at least two disadvantages. First, if the feedback value requires filtering to remove a switching component (such as in switching amplifier designs), signal phase shifts may be introduced. These must be compensated for by the control electronics, the net effect of which is a reduced control signal frequency bandwidth. Second, the physical design of the mechanical system which utilizes the capacitive load may not lend itself to having additional sensors and wires for the feedback loops from the load back to the controlling amplifier circuit.

Accordingly, there is a need to compensate for the nonlinear response characteristics of a capacitive load without the use of feedback loops from the load to the controlling amplifier, and without the need for relative large reference capacitors.

SUMMARY OF THE INVENTION

The present invention relates to a method and apparatus for compensating for the nonlinear current response of a capacitive load by predictably non-linearizing the drive voltage waveform at the controlling amplifier in advance of the load, effectively linearizing the current through the load. Utilizing a nonlinear capacitive reference element, which exhibits the same nonlinear characteristics as the capacitive load, in a local feedback loop around a single gain stage within the controlling amplifier circuit, the nonlinear characteristics of the capacitive load are anticipated and cancelled. The local feedback loop does not physically or electrically include the capacitive load, thereby eliminating the need for load sensors and feedback loops.

This invention is particularly useful where the capacitive load comprises a "stack" of several hundred ceramic wafers, (usually electrically connected in parallel) creating the load. The reference element could then be just a single wafer of the type used in the load, thus having only a small fraction of the load's capacitance, but at the same time, exhibiting the same nonlinear capacitance vs. voltage characteristics as the load.

In the preferred embodiment, compensation is performed by an inverting, high-gain operational amplifier in a voltage multiplier configuration. The input (summing) resistor is shunted by an input capacitor. A local feedback circuit comprising a reference capacitor shunted by a feedback resistor connects the amplifier output to the amplifier input so that the entire voltage developed across the load appears across the reference element in the local feedback circuit. The reference capacitor is matched to one of the load piezo wafers or is actually a replica of a load wafer. Values of the local feedback resistor and the combination resistor and capacitor at the amplifier input are selected for proper amplifier gain, as well as pole-zero cancellation, providing a flat frequency response.

The advantages and various features of the invention will be better understood after consideration is given to the following detailed description of the preferred embodiment together with the accompanying drawings.

BRIEF DESCRIPTION OF THE DRAWINGS

FIG. 5b shows the modified voltage and current waveforms where compensation in accordance with this invention is applied to correct the distorted current waveform of FIG. 5a.

DETAILED DESCRIPTION OF THE PREFERRED EMBODIMENTS

Figure 4:
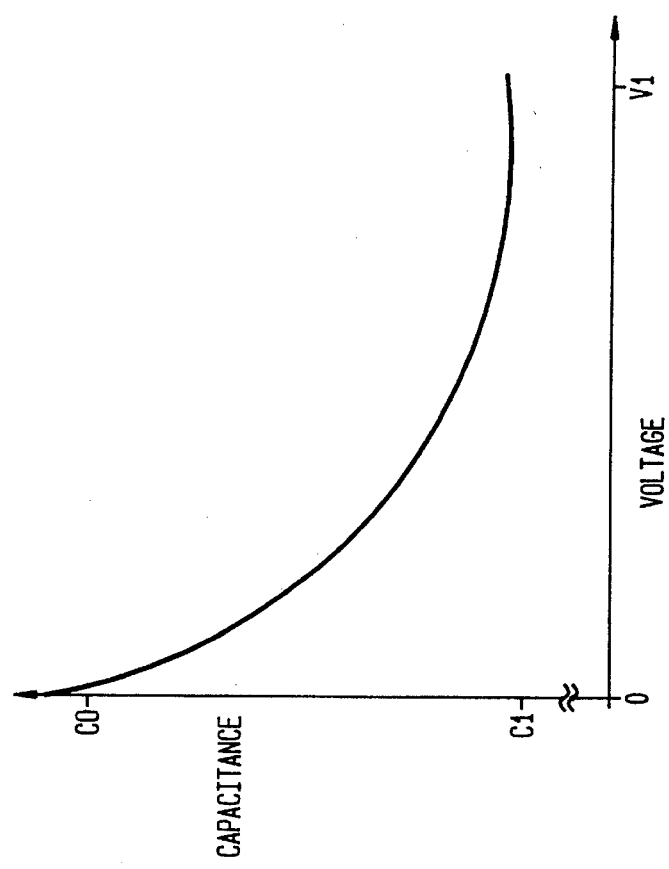
FIG. 4 shows a typical response characteristic of a capacitive load vs. applied voltage.
Figure 5A:
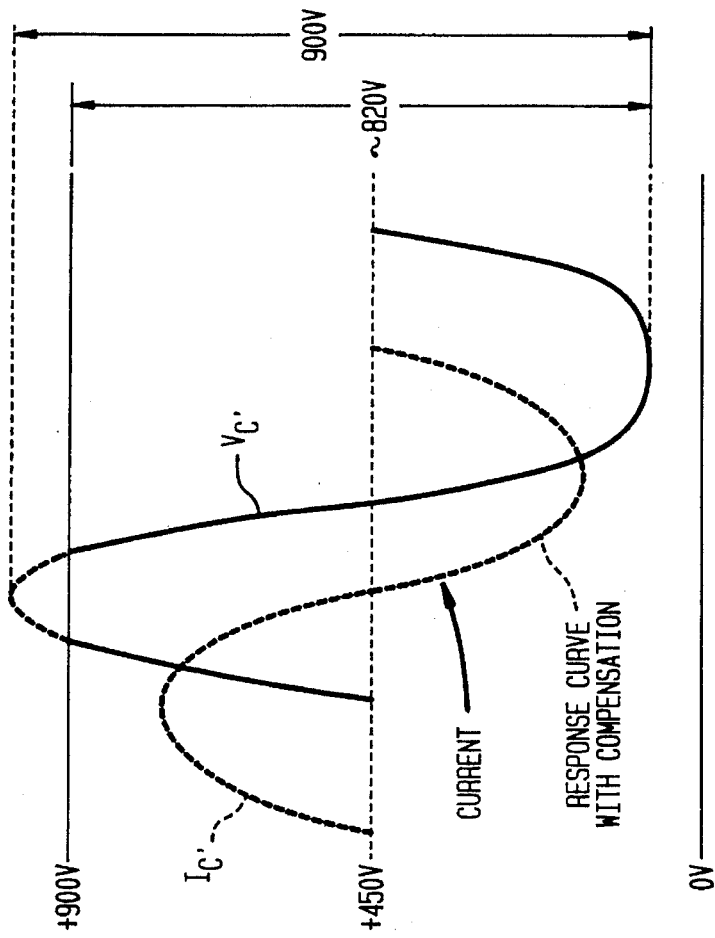
FIG. 5a depicts the voltage and current waveforms, exaggerated for clarity, without compensation for a capacitive load driven by a high-voltage amplifier.

Referring first to FIG. 4 and to FIG. 5a there is depicted the well known nonlinear capacitance vs. voltage curve response typical for ceramic capacitors. Similar nonlinear characteristics are, in fact, exhibited by all ceramic composition capacitors, to varying degrees. As the voltage increases from 0 to value V1 the capacitance of the load will decrease nonlinearly, from C0 to C1, as shown. As will be appreciated the current through the load, Ic, also changes nonlinearly in response to the changing capacitance. Specifically, FIG. 5a depicts a sinusoidal voltage, Vc (solid line) being applied across a capacitive load. The current, Ic, for a nonlinear capacitive load leads the voltage by 90° (dashed line) and is asymmetrical about the vertical axis. This nonlinear effect can be described mathematically by the following relationship.

$$Ic=C(Vc)dVc/dt$$

where

Ic=Current through the nonlinear capacitor
Vc=Voltage across the capacitor
C(Vc)=Voltage—dependent capacitance value of the load.

In practice it has been found that the distortion characteristics of the mechanical displacement of the ceramic loads follow closely the distortion characteristics of the load current. In other words, if the current through the ceramic load is distorted, the mechanical displacement of the capacitve ceramic load will also be distorted.

Figure 1:
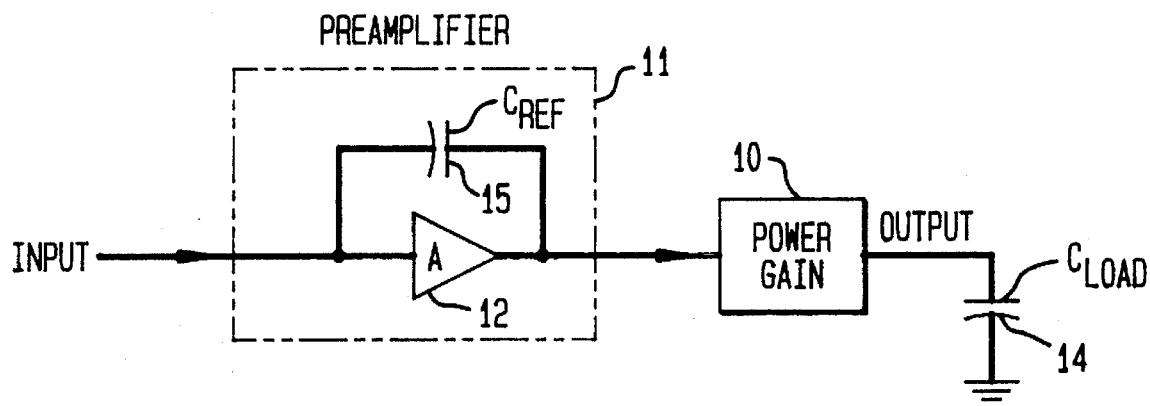
FIG. 1 shows a block diagram of a controlling amplifier utilizing nonlinear compensation based on a reference capacitor $C_{ref}$ for driving nonlinear loads.
Figure 5B:
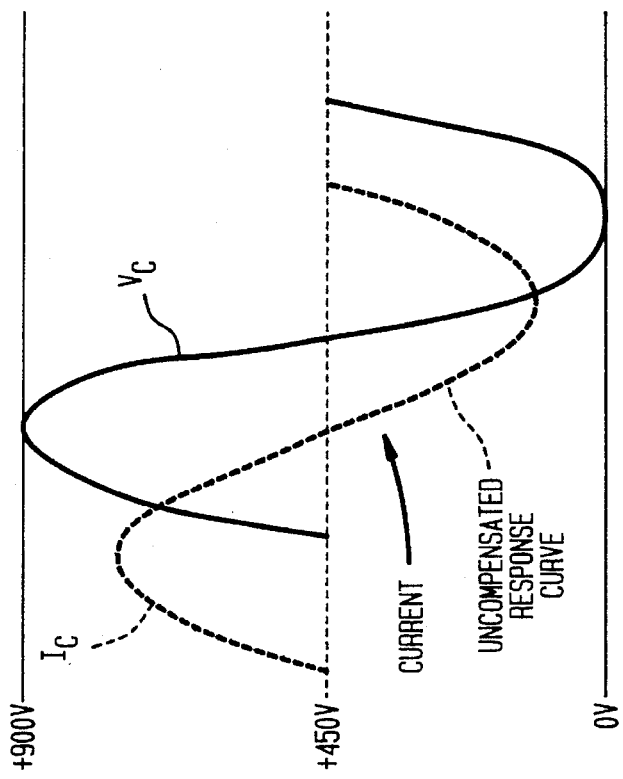

FIG. 1 illustrates the invention working with a power gain amplifier, 10, shown in block diagram form. Amplifier 10 is connected to the output of preamplifier, 11, where nonlinear compensation, in accordance with this invention, is added. Preamplifier, 11 develops the entire range of voltage across a single gain stage, 12. Preamplifier 11 delivers a predictably shaped waveform to "power gain" stage, 10, which, in turn, drives a capacitive load, $C_{load}$ identified by numeral 14. The compensation network pre-conditions the signal delivered to power gain amplifier 10 so that the non-linear impacts of the load are cancelled, leaving current and voltage waveforms as depicted in FIG. 5b.

Figure 6:
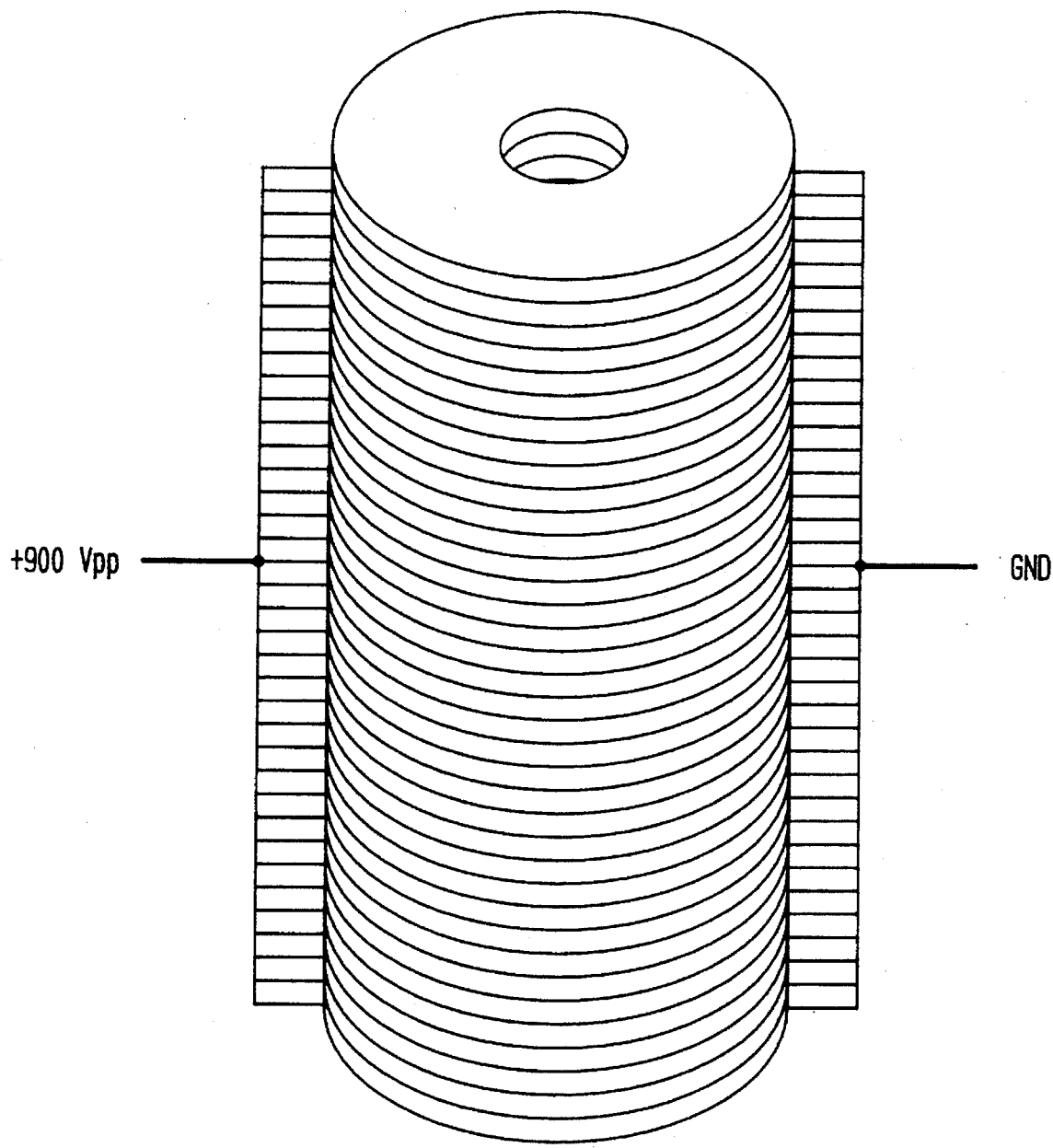
FIG. 6 shows a typical PMN stack representative of a capacitive load.

A capacitive reference element, $C_{ref}$ 15 with nonlinear capacitance vs. voltage characteristics identical to that exhibited by the load, is shown connected across the single gain stage 12 in preamplifier 11. In this configuration reference element 15 has significantly lower capacitance than the capacitive value of load 14, allowing the use of readily-available circuit components. For example, capacitive load 14 could consist of a "stack" of several hundred ceramic wafers (see FIG.6), electrically connected in parallel, creating a large capacitive load. Reference element 15 could then consist of just one wafer of the type used in the reference load.

For the nonlinear characteristics of the load to be properly canceled, reference element 15 must have the same voltage across it as does load 14. To achieve this, reference element 15 is placed "across" the single gain stage, 12, of the preamplifier 11 thus the entire voltage range, developed by the single gain stage 12 within the preamplifier 11, and eventually developed across the load, is also developed across reference element 15.

Power gain stage 10 does not create any voltage gain or loss within the frequency bandwidth of interest.

Figure 2:
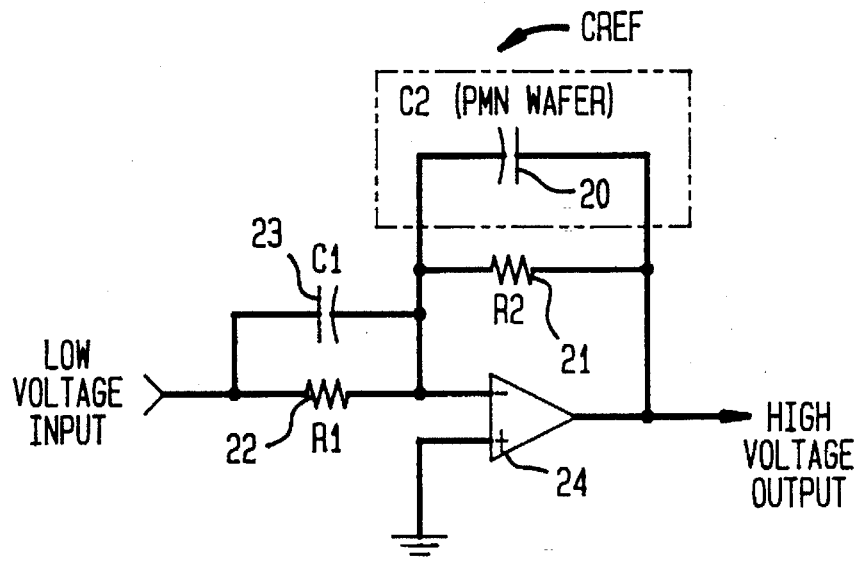
FIG. 2 depicts a high gain operational amplifier stage showing nonlinear compensation in accordance with the invention.
Figure 3:
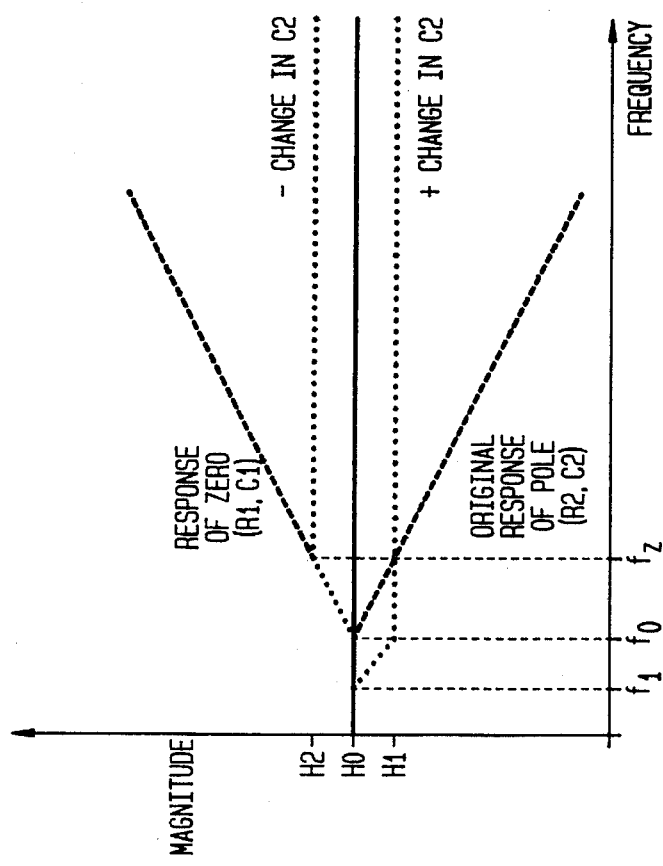
FIG. 3 describes graphically the transfer function dependence of the reference capacitor $C_{ref}$ shown in FIG. 2.

FIGS. 2 and 3 provide a more detailed illustration of the nonlinear compensation circuit in accordance with the present invention. In FIG. 2 capacitor 20 is the reference element, $C_{ref}$. The combination of resistor 21(R2) and capacitor 20(C2) creates a frequency pole (fp) at $$fp = \tfrac{1}{2}\pi R2 C2^{Hz}$$

Where R2=value of resistor 21
C2=value of capacitor 20

This pole, by itself, would result in a frequency response corresponding to the downward-sloping dashed line in FIG. 3. The effect of this pole can be canceled with resistor 22(R1) and capacitor 23(C1) shown at the input of amplifier 24. This network (R1 & C1) creates a frequency zero (fz) at $$fz = \tfrac{1}{2}\pi R1 C1^{Hz}$$

Where R1=value of resistor 22
C1=value of capacitor 23

This zero, by itself, would result in a frequency response corresponding to the upward-sloping dashed line in FIG. 3. When the values of networks R1/C1 and R2/C2 are chosen such that fp=fz, the frequency response of the pole and zero acting together cancel or compensate for each other. The solid horizontal line in FIG. 3 corresponds to this overall frequency response.

Some restrictions on the selection of R1, R2, C1 and C2 exist. The transfer function of the circuit (in the Laplace domain) in FIG. 2 is $$H(s) = {}^{-R2}/R1 {}^{[(1+R1C1s)/(1+R2C2s)]}$$

Since the DC gain of the stage is determined by choosing (non-reactive elements) resistors 21(R2) and 22(R1) these values are usually determined by load driving considerations. The value of the reference element capacitor 20(C2), is restricted because its key contribution to this arrangement is derived from its nonlinear characteristics, which must be as close as practical to the nonlinear characteristics of the load. These characteristics, along with its capacitance are, in large part, determined by the physical dimensions of the reference element. This leaves the choice of capacitor 23(C1), which is the circuit element value needed to make fp=fz. Consider now a negative capacitance change in capacitor 20(C2), ΔC2, caused by the development of a high voltage from the input to the output of amplifier 24 (which appears almost entirely across reference capacitor 20). Decreasing C2 by ΔC2 causes the pole, fp, to move higher in frequency to fp':

$$fp' = \tfrac{1}{2}\pi R2(C2-\Delta C2)^{Hz}$$

The corresponding frequency response is shown in FIG. 3 as the dotted line ("-change in C2"). Note that the frequency response still compensates, but at a higher frequency f2, and at a higher magnitude, H2, than previously. Practically, the pole and zero are made to cancel at a very low frequency so as to be out of the operating bandwidth of the driving amplifier. In summary, the gain of this nonlinear compensation stage is dynamic and dependent upon the input voltage to the circuit.

The Table below provides component values for a working arrangement driving a ceramic capacitive load.

TABLE

| Component | Value |
| --- | --- |
| R1 | 19.6 KΩ |
| R2 | 1 MΩ |
| C1 | 3 μF |
| C2 | 110 nF |
| Ampl. 24 | Apex PA89 |

FIGS. 5a and 5b are illustrative of the voltage Vc across and current Ic through a 60 uF ceramic capacitive load, before and after the preferred embodiment of nonlinear compensation is applied. In the working arrangement, a 22 Hz sinusoidal waveform was applied to the input of the amplifier such that the output voltage across the load was 900 V. In FIG. 5a the amplifier output voltage (with no nonlinear compensation) is sinusoidal, as is the voltage across the load. The current through the load, however, is asymmetrical about the vertical axis, indicating severe even-harmonic distortion, resulting from the nonlinear capacitance vs. voltage characteristic of the ceramic capacitive load. In FIG. 5b, with nonlinear compensation applied, the gain of the amplifier changes with the sinusoidal input signal, distorting the output voltage waveform, but linearizing the current waveform, significantly reducing the even-harmonic distortion. These are identified in FIG. 5b as voltage Vć and current Ić.

As was discussed above, the harmonic distortion characteristics of the mechanical displacement of the ceramic capacitive load are largely determined by the harmonic distortion content of the current waveform through the same. In FIG. 5a, with no nonlinear compensation applied, the mechanical displacement of the load would exhibit severe even-harmonic distortion, similar to the current waveform shown. With nonlinear compensation applied, the even-harmonic distortion component of the mechanical displacement of the load would be significantly reduced, as it is in the current waveform in FIG. 5b.

I claim:

1. A pre-amplifier arrangement for providing compensation for linearizing the nonlinear current response of capacitive loads comprising, a load reference element having substantially the same nonlinear characteristics as said load and a capacitance vs. voltage response characteristic substantially identical to that of said load, said load reference element being connected between said amplifier input and output connections so that the same voltage across said capacitive load is across said reference element; and a first network connected to the input of said amplifier having a frequency zero (fz) complementing the frequency pole (fp) of said load reference element so as to cancel one another thereby providing linear current flow in nonlinear capacitive loads.

2. The invention set forth in claim 1 further including a non-reactive device connected in parallel across said load reference element working in combination with said first network to set the DC gain of said pre-amplifier arrangement.

3. The invention set forth in claim 1 wherein said load reference element is a wafer and said load is a stack comprising a plurality of said wafers.

4. The invention set forth in claim 1 wherein said first network comprises a non-reactive element in parallel with a capacitive element.

5. The invention set forth in claim 4 further including a non-reactive device connected in parallel across said load reference element, forming a second network having a second frequency response, and wherein the frequency responses of the first and second networks cancel one another so as to provide a flat frequency response and compensate for the nonlinear load response.

6. A method for providing compensation for an amplifier circuit driving capacitive loads to minimize undesired harmonic distortion in the current waveform through such capacitive loads comprising selecting a reference element having capacitance vs. voltage response characteristics substantially identical to those of the load whose waveform response contains the undesired harmonic distortion, utilizing the reference element in said amplifier circuit to alter the driving voltage waveform so as to non-linearize the amplified voltage waveform predictably in anticipation of the undesired harmonic distortion created by the load, and coupling the non-linearized amplified voltage waveform to said load wherein the capacitance vs. voltage characteristic of the load transforms the non-linearized voltage waveform to a linearized current waveform without harmonic distortion.

7. The method recited in claim 6 further including the step of:

connecting input signal to said amplifier circuit through a reactive network having a frequency response opposite that of said reference element.

8. A compensation circuit for nonlinear response capacitive loads which eliminates the need for feedback loops interconnected with said load comprising;

a first network having a load reference element with substantially the same non-linear response characteristics as said load and a capacitance vs. voltage response characteristic substantially identical to that of said load, a second network having a frequency zero (fz) opposite a frequency pole (fp) of said first network which complements one another, and an amplifier with input signal coupled through second network and said first network being connected to said amplifier input and to said load so that the same voltage is across both the first network and said load thereby forming a local feedback circuit from amplifier output to said input.

9. The invention recited in claim 8 wherein said load consists of a stack having a plurality of wafers, and said load reference element is a wafer of the same type as comprises said load.

10. The invention recited in claim 8 wherein said first and second networks set the DC gain of said amplifier.

11. The invention recited in claim 9 wherein said second network comprises a resistor whose value determines, in part, both the DC gain of said amplifier as well as the frequency response of said second network.

12. The invention recited in claim 11 wherein said second network includes a capacitor in parallel with said resistor.

13. The invention recited in claim 8 wherein said first network includes a resistor connected in parallel with said load reference element, and said resistor determines together with said second network the DC gain of said amplifier as well as the frequency response of said first network.

14. A high voltage amplifier circuit arrangement for driving a piezoelectric actuator which comprises a plurality of ceramic wafers and exhibits the nonlinear response characteristics of a large capacitive load including:

a first network comprising a resistor/capacitor combination having a zero frequency response characteristic defined by $\frac{1}{2\pi RC}$ Hz, said first network connected to an input of said amplifier circuit, a local feedback network comprising a ceramic wafer in combination with a resistor connected between an output of said amplifier circuit and said input, and the pole frequency response of said local feedback network being equal to ½πRC Hz where the value of C is the capacitive value of said wafer.

15. The claim recited in claim 14 wherein the values of said resistors in said first network and local feedback network establish the DC gain of said amplifier.

16. A circuit arrangement for providing a high-voltage drive to a load including a plurality of ceramic wafers while also compensating for the nonlinear response characteristic of the capacitive nature of such loads comprising an operational amplifier having an input and output, a first input network comprising a first capacitor and a first resistor connected in parallel through which input signals are provided to said amplifier, a local feedback circuit comprising at least one ceramic wafer of the same type as those comprising said load connected in parallel with a second resistor, said local feedback circuit being connected between said input and output of said operational amplifier, and wherein the frequency response of said first input network is opposite and cancels the frequency response of said local feedback circuit.

17. The invention set forth in claim 16 wherein the D.C. gain of said amplifier is established by the relative values of the first resistor and the second resistor.

* * * * *